US 011114705B2

(12) United States Patent
Genannt Berghegger et al.

(10) Patent No.: US 11,114,705 B2
(45) Date of Patent: Sep. 7, 2021

(54) CURRENT MEASUREMENT AND VOLTAGE CONTROL APPROACH

(71) Applicant: Honeywell International Inc., Morris Plains, NJ (US)

(72) Inventors: Ralf Schroeder Genannt Berghegger, Glandorf (DE); Claas Gerdes, Brochterbeck (DE)

(73) Assignee: Honeywell International Inc., Charlotte, NC (US)

(*) Notice: Subject to any disclaimer, the term of this patent is extended or adjusted under 35 U.S.C. 154(b) by 3 days.

(21) Appl. No.: 16/686,899

(22) Filed: Nov. 18, 2019

(65) Prior Publication Data

US 2020/0161718 A1     May 21, 2020

Related U.S. Application Data

(60) Provisional application No. 62/770,701, filed on Nov. 21, 2018.

(51) Int. Cl.
*H01M 10/44* (2006.01)
*G01R 31/3842* (2019.01)
*H01M 10/42* (2006.01)

(52) U.S. Cl.
CPC ...... *H01M 10/448* (2013.01); *G01R 31/3842* (2019.01); *H01M 10/4257* (2013.01); *H01M 2010/4271* (2013.01)

(58) Field of Classification Search
CPC ........... H01M 10/448; H01M 10/4257; H01M 2010/4271; H01M 10/48; H01M 10/425; H01M 10/44; G01R 31/3842; Y02E 60/10

(Continued)

(56) References Cited

U.S. PATENT DOCUMENTS 4,006,396 A * 2/1977 Bogut ............... H02J 7/0091
                                                    320/125
5,250,891 A * 10/1993 Glasgow ............. H02J 7/022
                                                    320/140

(Continued)

FOREIGN PATENT DOCUMENTS

WO   WO-2008154031 A2 * 12/2008 .......... H02M 3/1563

OTHER PUBLICATIONS

PCT/US2019/047648, International Search Report and Written Opinion, pp. 9, dated Dec. 12, 2019.

*Primary Examiner* — M Baye Diao
(74) *Attorney, Agent, or Firm* — Seager, Tufte & Wickhem, LLP

(57) ABSTRACT

A circuit that indicates a warning of low battery life so that an instrument supported by a battery, may have the battery replaced before the battery dies. A switch and series resistor may be connected between the battery and a capacitor. The switch may turn on when the voltage on the capacitor is below a first predetermined voltage limit, and the switch may be turned off when the voltage at the capacitor is above a second predetermined voltage limit. When the switch is on, a voltage on the resistor can be measured and current consumption can be calculated with measured voltage, resistor value and duty cycle of the switch. When the battery is discharged, its internal resistance and then its duty cycle may increase. When the duty cycle hits 100 percent, the battery may be nearly dead but with enough life for the circuit to issue the low battery warning.

20 Claims, 6 Drawing Sheets

(58) Field of Classification Search
USPC .......................................................... 320/132
See application file for complete search history.

(56) References Cited

U.S. PATENT DOCUMENTS

| | | | | |
|---|---|---|---|---|
| 5,355,073 A | * | 10/1994 | Nguyen | H01M 10/44 320/116 |
| 5,574,358 A | * | 11/1996 | Garrett | G05F 1/465 323/276 |
| 5,587,916 A | * | 12/1996 | Martinson | G01R 19/16542 323/224 |
| 5,711,507 A | | 1/1998 | Berget et al. | |
| 5,898,293 A | * | 4/1999 | Tamai | H02J 7/0031 320/136 |
| 6,198,243 B1 | | 3/2001 | Ritmanich et al. | |
| 6,439,504 B1 | * | 8/2002 | Ahrendt | F02K 1/763 239/265.19 |
| 7,772,852 B2 | * | 8/2010 | Fechalos | G01R 31/389 324/430 |
| 8,274,263 B2 | * | 9/2012 | McPherson | H02J 9/005 320/155 |
| 8,742,674 B2 | * | 6/2014 | Shteynberg | H05B 45/14 315/201 |
| 9,077,189 B2 | * | 7/2015 | Han | H02J 7/0029 |
| 9,284,825 B2 | * | 3/2016 | Yu | F16K 17/386 |
| 9,412,270 B2 | | 8/2016 | Neel et al. | |
| 9,685,804 B2 | * | 6/2017 | Touchton | H02J 7/0047 |
| 10,090,690 B2 | * | 10/2018 | Abe | H02J 7/0029 |
| 10,744,963 B2 | * | 8/2020 | Konishi | G01R 31/3278 |
| 2009/0051340 A1 | * | 2/2009 | Wang | H02M 3/156 323/305 |
| 2016/0141985 A1 | | 5/2016 | Viscardi et al. | |
| 2016/0201575 A1 | | 7/2016 | Bertsch, IV et al. | |
| 2017/0156184 A1 | * | 6/2017 | Knoedgen | H05B 45/3725 |
| 2018/0080649 A1 | | 3/2018 | Kucera et al. | |

\* cited by examiner

CURRENT MEASUREMENT AND VOLTAGE CONTROL APPROACH

This application claims the benefit of U.S. Provisional Patent Application Ser. No. 62/770,701, filed Nov. 21, 2018. Provisional Patent Application Ser. No. 62/770,701, filed Nov. 21, 2018, is hereby incorporated by reference.

BACKGROUND

The present disclosure pertains to circuits for indicating power source conditions.

SUMMARY

The disclosure reveals a circuit that indicates a warning of low battery life so that an instrument supported by a battery, may have the battery replaced before the battery dies. A switch and series resistor may be connected between the battery and a capacitor. The switch may turn on when the voltage on the capacitor is below a first predetermined voltage limit, and the switch may be turned off when the voltage at the capacitor is above a second predetermined voltage limit. When the switch is on, a voltage on the resistor can be measured and current consumption can be calculated with measured voltage, resistor value and duty cycle of the switch. When the battery is discharged, its internal resistance and then its duty cycle may increase. When the duty cycle hits 100 percent, the battery may be nearly dead but with enough life for the circuit to issue the low battery warning.

BRIEF DESCRIPTION OF THE DRAWING

FIG. 5 is a diagram of a detailed view of one measurement while charging is on; and FIG. 6 is a diagram of a detailed view of one measurement while charging is off and a transition is from off to on.

DESCRIPTION

Figure 1:
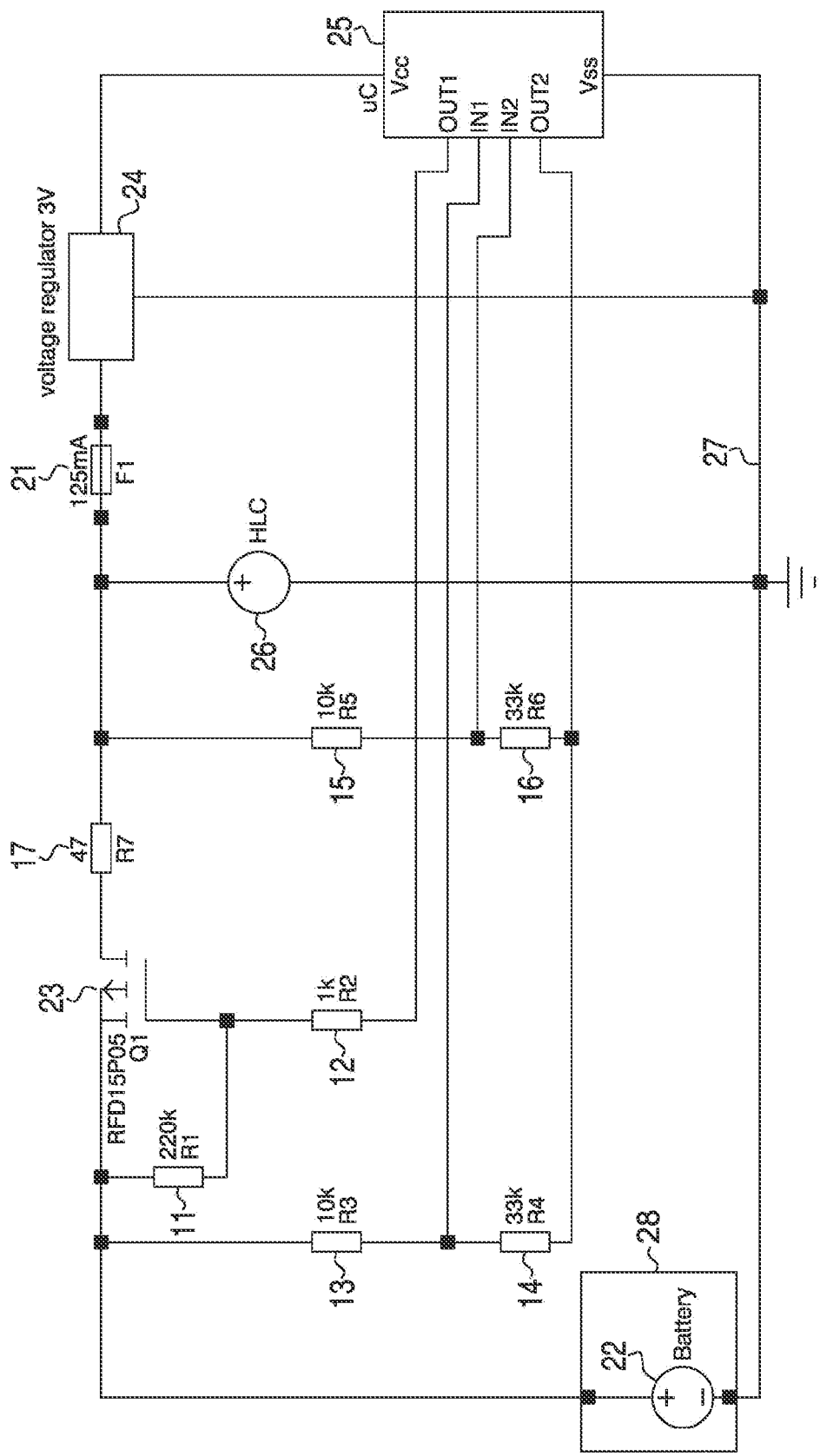
FIG. 1 is a diagram of a circuit for current measurement and voltage control.

The present system and approach may incorporate one or more processors, computers, controllers, user interfaces, wireless and/or wire connections, and/or the like, in an implementation described and/or shown herein.

This description may provide one or more illustrative and specific examples or ways of implementing the present system and approach. There may be numerous other examples or ways of implementing the system and approach.

A battery powered gas metering unit may have a very low standby current (e.g., <10 uA), but there may be actions that may draw much higher current (e.g., 1.6 A peak for Global System for Mobile (GSM) communications). To predict the lifetime of the battery, the average current may need to be evaluated.

Measurement of the current appears difficult due to a big current range. A combination of a battery and a hybrid layer capacitor (HLC) may be used. The hybrid layer capacitor may provide low internal resistance at a low capacity. The battery may have high capacity, but high internal resistance. Peak current may be provided mainly by the hybrid layer capacitor which can be recharged by the battery. This may reduce the peak current from the battery. Still, the current range at the battery may be very large (e.g., <10 uA to 10 mA) which makes it difficult to measure the current.

In the related art design, current consumption may be calculated by adding the amount of current that each action typically draws. This approach is not necessarily precise and it may omit current which is drawn due to faults.

A need of a gas meter may be that a warning must be generated when the remaining battery life is below a certain predetermined limit. With the related art design, this warning cannot necessarily be given precisely which means that the battery needs to be bigger to provide enough remaining battery life after the warning due to inaccuracies.

The batteries that are commonly used in gas meters may be lithium thionyl chloride batteries. These batteries may provide a voltage up to 3.9V (i.e., 3.6V nominal). Common microcontrollers and other components may have a maximum working voltage of 3.6V. Therefore, a voltage regulator may be needed to limit the voltage to below 3.6V.

The present system and approach may enable measurement of total current consumption without adding cost to the current design. It could be actually cheaper than the related art design. The present design may enable better calculation of the remaining battery life. Additionally, this design may help with the diagnosis in case of a failure. For example, if battery life is less than predicted, it may help to find a root cause of a problem. Utilization of the battery may be improved. The low battery warning may be generated more precisely. Therefore, the battery issues may be minimized.

In opposition to the related art approach, the present approach may enable a correct warning even in case of a current that has been increased by an error. Additionally, the present approach may provide a means to easily detect an almost discharged battery. Due to this approach, the gas meter may be replaced before the battery is empty, dead or discharged. This approach may reduce a risk of uncounted gas consumption or other kind of metered provision or other consumable. In certain situations or designs, the battery may be rechargeable. Another benefit of the present approach may be that it enables a voltage limit without additional components. Therefore, for instance, a voltage regulator may be omitted.

A switch (e.g., a MOSFET) and a serial resistor may be connected between a battery and a hybrid layer capacitor (HLC). The switch may be switched on when the voltage of the HLC is below a certain predetermined first voltage limit. It may be switched off when the voltage at the HLC is above a second (e.g., a higher voltage or the same voltage) limit. The capacitor may be another type such as a super capacitor or even a standard capacitor, rather than an HLC.

When the switch is on, a voltage at the resistor may be measured. The voltage at the resistor may be proportional to the charge current at the HLC. So the average current consumption may be calculated using the measured voltage, the resistor, and the duty cycle of the switch. The charge current may be in a predefined range given by the voltage limits and the resistor value. Therefore, the current may be measured quite precisely.

When the battery is discharged, its internal resistance may rise. Therefore, the duty cycle of the switch may rise. So an almost discharged battery may be detected by measuring the increased duty cycle. Thus, the battery may be almost empty or dead when the duty cycle is 100 percent.

The second limit may be used to limit the voltage at the HLC to a voltage that is safe for the microcontroller and the other components, e.g., 3.6 VDC.

The present design may have a software component. A stack level may be at a sensor, that is, a hardware device with some embedded software measuring/detecting and transmitting data (e.g., temperature, pressure, motion). The software type may be embedded, that is, software that runs in a device/unit (e.g., firmware).

FIG. 1 is a diagram of a circuit for current measurement and voltage control. A P-channel power MOSFET 23 (RFD15P05) may have a source connected to a plus terminal of a battery 22, a first terminal of a 220 k ohm resistor 11, and a first terminal of a 10 k ohm resistor 13. A gate of MOSFET 23 may be connected to a second terminal of resistor 11 and to a first terminal of a 1 k ohm resistor 12. A drain of MOSFET 23 may be connected to a first terminal of a 47 ohm resistor 17.

A negative terminal of battery 22 may be connected to a ground 27. A second terminal of resistor 13 may be connected to a first terminal of a 33 k ohm resistor 14 and to an IN1 terminal of a microcontroller 25 (e.g., STM32L151 from STMicroelectronics). A second terminal of resistor 12 may be connected to an OUT1 terminal of microcontroller 25.

A second terminal of resistor 17 may be connected to a first terminal of a 10 k ohm resistor 15, to a positive terminal of hybrid layer capacitor (HLC) 26, and to a first terminal of a 125 ma fuse 21. Fuse 21 is for explosion protection. A second terminal of resistor 15 may be connected to a first terminal of a 33 k ohm resistor and to an IN2 terminal of microcontroller 25. A second terminal of resistor 14 may be connected to a second terminal of resistor 16 and to an OUT2 terminal of microcontroller 25.

HLC 26 may have a negative terminal connected to ground 27. A second terminal of fuse 21 may be connected to a first terminal of a 3 volt voltage regulator 24 (e.g., XC6504A30 from TOREX). Regulator 24 enables a higher voltage at HLC 26 than at microcontroller 25. A second terminal of regulator 24 may be connected to ground 27. A third terminal of regulator 24 may be connected to a Vcc terminal of microcontroller 25. Vss terminal of microcontroller 25 may be connected to ground 27. Fuse 21 and regulator 24 are not necessarily needed.

Battery 22 may be inserted or situated in a battery receptacle 28 (e.g., a battery holder or connector). When inserted or situated in the battery receptacle 28, a connection may be made between a first terminal of the battery receptacle 28 and a positive terminal of the battery 22 and a connection may be made between a second terminal of the battery receptacle and a negative terminal of the battery 22. The first terminal of the battery receptacle 28 may be connected to the source of the MOSFET 23. The second terminal of the battery receptacle 28 may be connected to the negative terminal of the HLC 26.

Figure 2:
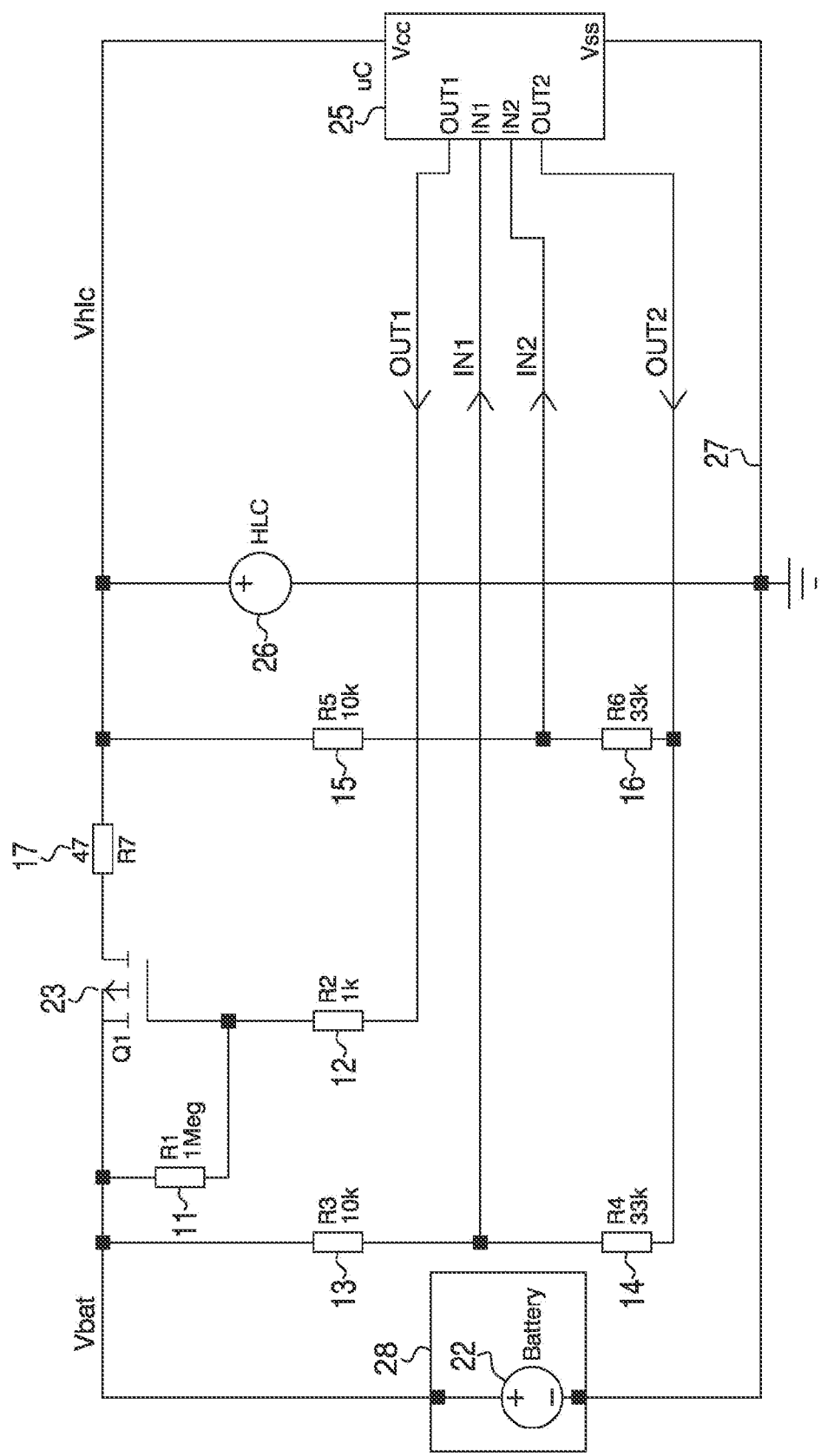
FIG. 2 is a diagram of a circuit like that of FIG. 1 but without the fuse and voltage regulator.

FIG. 2 is a diagram of another circuit for measurement of HLC voltage and detection of a battery. A microchip (uC) may have a function BATT_EN at pin OUT1, IN1, HLC_SENSE at pin IN2, and STROBE at OUT2. In the diagram, resistor 13 (R3), resistor 14 (R4), resistor 15 (R5), and resistor 16 (R6) equal an integrated resistor network. Resistor 12 (R2), resistor 13 (R3), resistor 15 (R5), resistor 17 (R17) and fuse 21 (F1) equal ATEX.

The internal resistance of Q1 should be very low compared to R7.

The voltage dividers R3/R4, R5/R6 reduce the voltage at IN1 and IN2 of the Microcontroller (uC) to a level below Vhlc when OUT2 is low. This enables the measurement with the internal ADC of the uC. (In this configuration IN1 and IN2 must be capable handling more than Vhlc when OUT2 is switched to input mode.)

When Q1 is switched off (OUT1=high) IN1 can be used to detect if a battery is present.

Switch (e.g., a MOSFET) 23 and a resistor 17 connected in series with switch 23 may be connected at one end to a battery 22 and connected at the other end to a hybrid layer capacitor 26. Switch 23 may switch on when the voltage on capacitor 26 below a certain limit. Switch 23 may switch off when the voltage on capacitor 26 is higher or the same than a second voltage limit. When switch 23 is on, the voltage at resistor 17 may be measured. The voltage at resistor 17 may be proportional to the charge current of capacitor 26. Thus, the average current consumption can be calculated using the measured voltage, the resistor 17 value and the duty cycle of switch 23. The charge current is in a predefined range given by the voltage limits and the resistor 17 value. Thus, the charge current can be measured rather precisely.

When battery 22 is discharged, the internal resistance of battery 22 rises. Therefore, the duty cycle of the battery increases. Thus, an almost discharged battery can be detected by measuring the duty cycle. The battery is almost dead when the duty cycle is 100 percent. The second limit can be used to limit the voltage at HLC 26 to a voltage that is safe for the microcontroller and other components.

Figure 3:
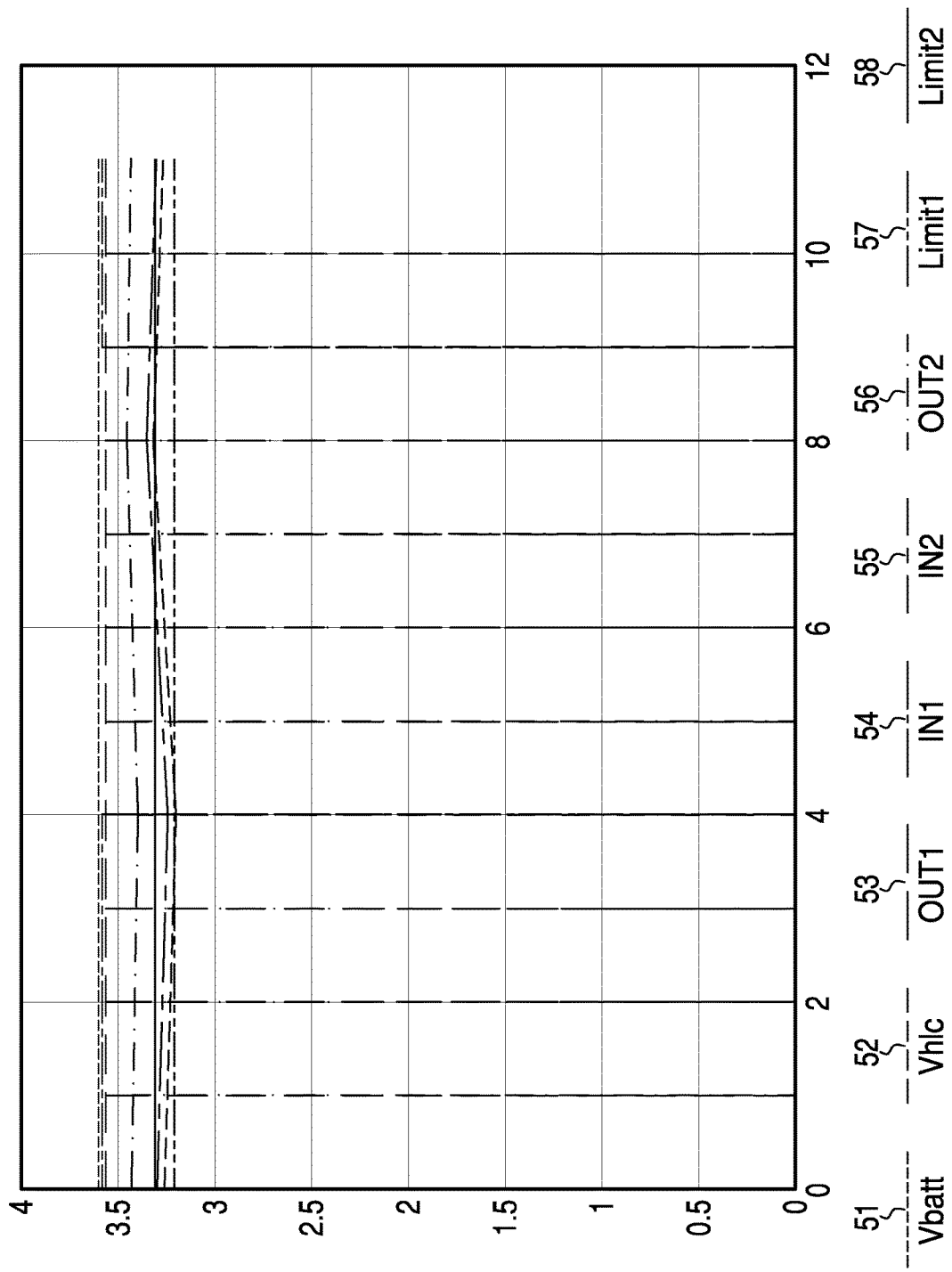
FIG. 3 is a diagram is a diagram of an overview of waveforms at one measurement per unit time.

FIG. 3 is a diagram of an overview of waveforms at one measurement per second, a lower limit 3.2V, and an upper limit 3.3V. A measurement may be enabled when OUT2 (line 56) is low. When Vhlc (line 52) gets below Limit1 (line 57), then OUT1 (line 53) is switched to low. This activates the charge current.

When Vhlc (line 52) gets higher than Limit2 (line 58), then OUT1 (line 53) is switched to high. This deactivates the charge current.

It would also work with just one limit which reduces the voltage ripple, but increases current consumption due to higher switching frequency (ripple voltage and current consumption depending on the measurement frequency).

Measurement frequency can be different, even continuous monitoring of the voltage is possible, but this would increase current consumption (higher measurement frequency leads to more precise voltage control, and lower measurement frequency leads to less current consumption).

Figure 4:
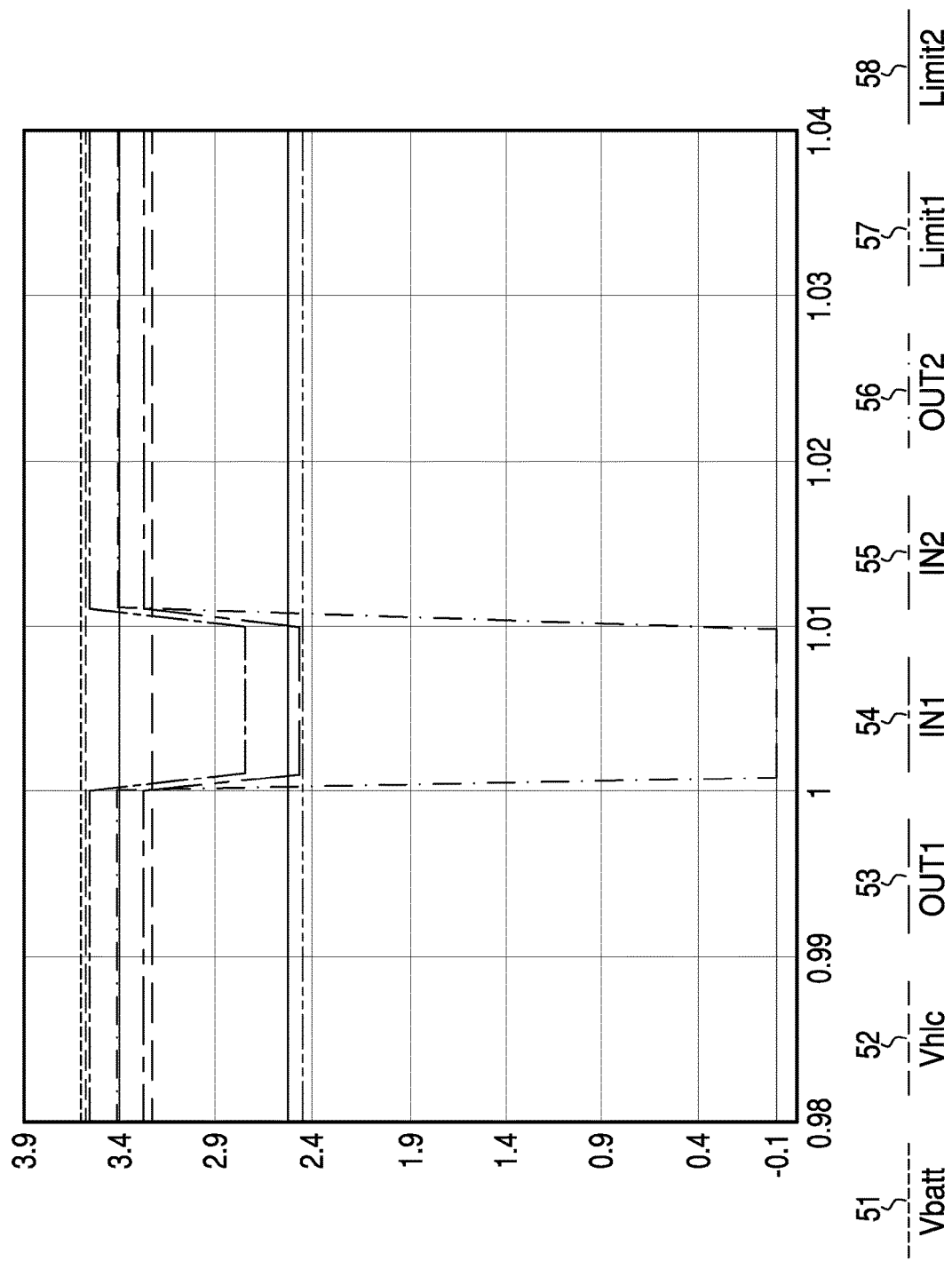
FIG. 4 is a diagram of a detailed view of one measurement while charging is off.

FIG. 4 is a diagram of a detailed view of one measurement while charging is off. When OUT2 (line 56) is low, it is possible to evaluate the voltage at the Battery (Vbatt) (line 51) and the voltage at the HLC (Vhlc) (line 52). The voltage at IN1 (line 54) may be used to calculate Vbatt (line 51), where Vbatt=V(IN2)/R4*(R4+R3).

The voltage at IN2 (line 55) may be used to calculate Vhlc (line 52), where Vhlc=V(IN2)/R6*(R5+R6).

The off state charge current may be calculated, where Icharge_off=(Vbatt−Vhlc)/(R3+R4+R5+R6). Icharge_off should be significantly smaller than the average current consumption of the connected circuit.

If the voltage at IN2 (line 55) is between Limit1 (line 57) and Limit2 (line 58) while V(OUT2) is low, then the charge state is not changed.

Figure 5:
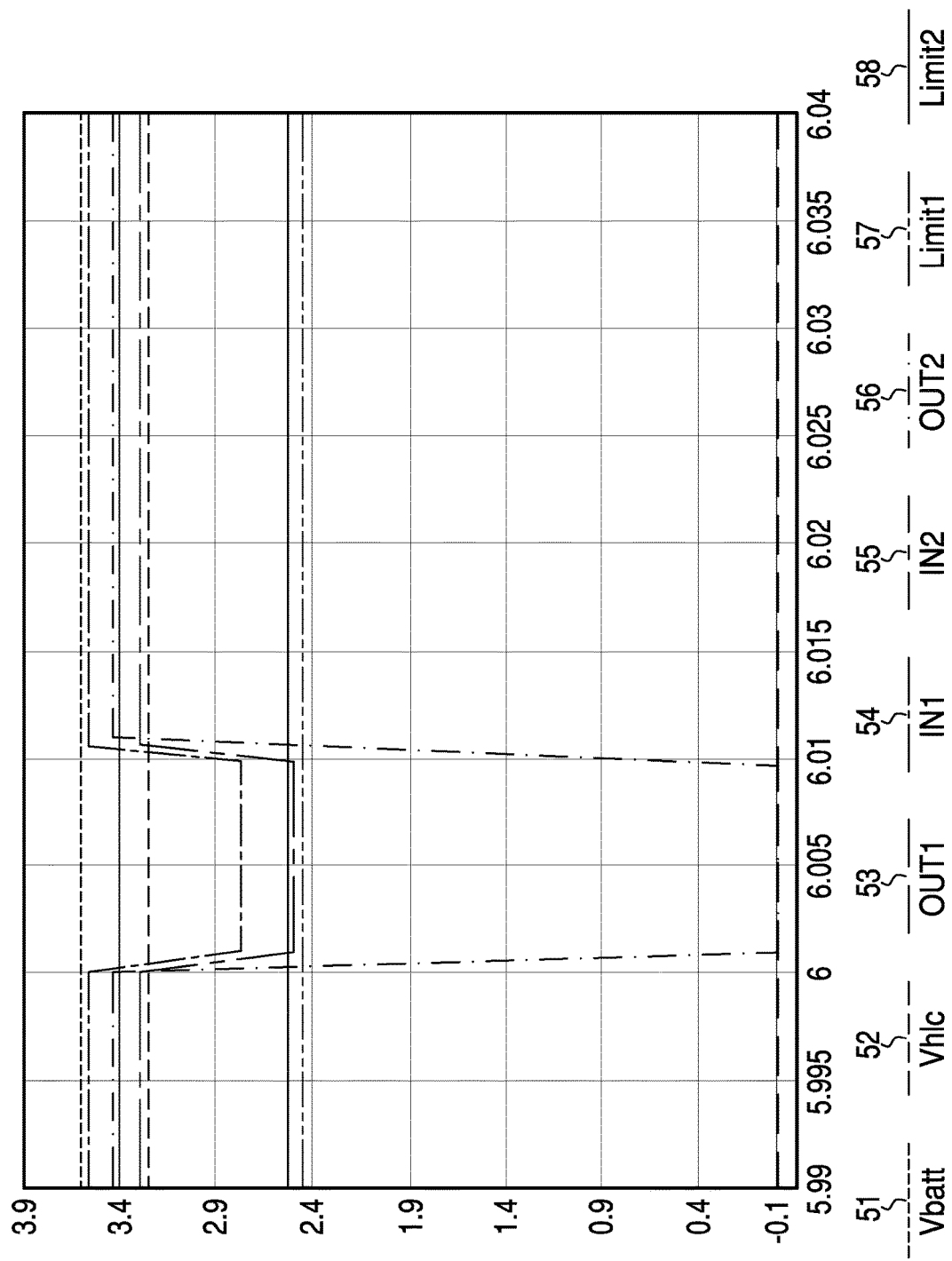

FIG. 5 is a diagram of a detailed view of one measurement while charging is on. When OUT2 (line 56) is low, it is possible to evaluate the voltage at the Battery (Vbatt) (line 51) and the voltage at the HLC (Vhlc) (line 52).

The voltage at IN1 (line 54) may be used to calculate Vbatt, where Vbatt=V(IN2)/R4*(R4+R3). The voltage at IN2 (line 55) may be used to calculate Vhlc (line 52), where Vhlc=V(IN2)/R6*(R5+R6).

The on state charge current may be calculated with Icharge_on=(Vbatt−Vhlc)/(R7+Rds on of Q1). (Rds on of Q1 should be small compared with R7.) Icharge_on should be significantly higher than the average current consumption of the connected circuit.

Figure 6:
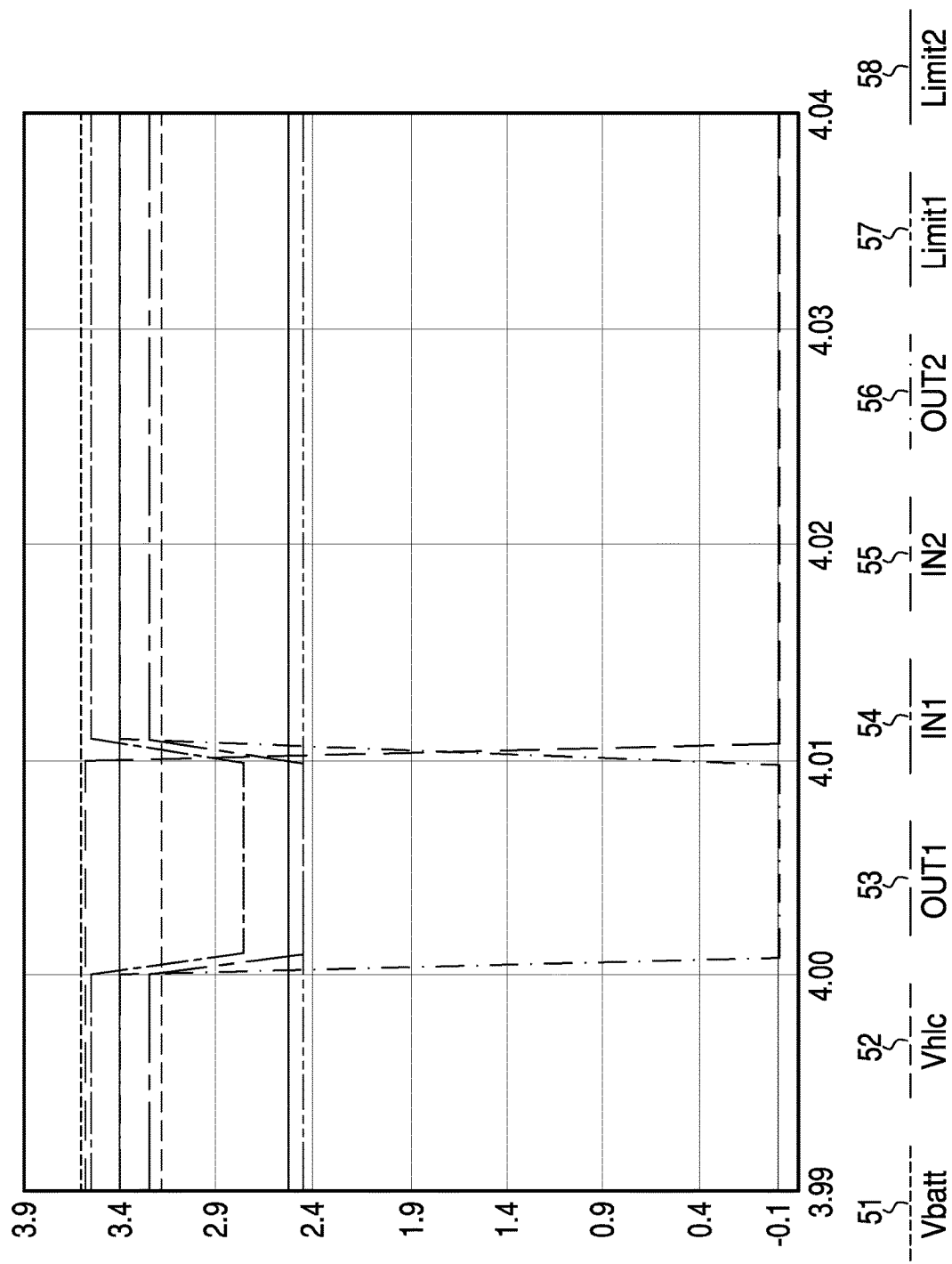

FIG. 6 is a diagram of a detailed view of one measurement while charging is off and a transition is from off to on. If the voltage at IN2 (line 55) is below Limit1 (line 57) while V(OUT2) (line 56) is low, then OUT1 (line 53) is set to low. This approach may activate the charge current. If the voltage at IN2 is above Limit2 (line 58) while V(OUT2) (line 56) is low then OUT1 (line 56) is set to high, then this may deactivate the charge current (not shown in the diagram).

Measurements may be made in production. Determination of calibration values may be made with steps 1-11.

Step 1 action may be to disconnect a battery 22. Step 2 may have no action with function BATT_EN having a certain status, and a certain level. There may be an output low or no pull depending on a charge status. Function BATT_SENSE may have an input status with no pull. HLC_SENSE may have an input status and a no pull level. Function STROBE may have an input status and a no pull level.

Step 3 may have an action of enable battery with a function BATT_EN having an input status and a low level, a function BATT_SENSE having an input status and a no pull level. Function HLC_SENSE may have an input status and a no pull level. Function STROBE may have an input status with a no pull level.

Step 4 may have an action to activate a STROBE with a function BATT_EN having an input status and a no pull level. Function BATT_SENSE may have an input status and a no pull level. Function HLC_SENSE may have an input status and a no pull level. Function STROBE may have an output status and a low level.

Step 5 may have an action to activate an ADC, with a delay to be determined. Function BATT_EN may have an input status and a no pull level. Function BATT_SENSE may have an input (ADC) status. Function HLC_SENSE may have an input (ADC) status. Function STROBE may have an outOut status and a low level.

Step 6 may have an action to measure a BATT_SENSE voltage and have a sampling time of 6 microseconds for fADC=16 MHz=>SMPX Bits=101. Function BATT_EN may have a status of input and a no pull level. Function BATT_SENSE may have a status of input (ADC) and a digital ADC valve range of 0 to 4095. Function HLC_SENSE may have a status of input (ADC). Function STROBE may have a status of input and a low level.

Step 7 may have an action to measure HLC_SENSE voltage and have a sampling time of 6 microseconds for fADC=16 MHz=>SMPX Bits=101. Function BATT_EN may have a status of an input and a no pull level. Function BATT_SENSE may have a status of input (ADC). Function HLC_SENSE may have a status of input (ADC). A digital value may range from 0 to 4095. Function STROBE may have a status of output and a low level.

Step 8 may have an action to measure VHLC real=V (HLC) with a voltmeter.

Step 9 may have an action to measure VBattval=V (Battery) with a voltmeter.

Step 10 may have an action to calculate calibration factors HLCcal=VHLCreal/HLC_SENSE, Batcal=VBATTreal/BATT_SENSE.

Step 11 may have no action. Function BATT_EN may have an output and a low level. HLC may be recharged from a battery. Function BATT_SENSE may have an input status and a no pull level. HLC_SENSE may have an input status and a no pull level. STROBE may have an input status and a no pull level.

Measurements may be made in normal operation. Battery detection may be noted. Step 1 may have no action. Function BATT_EN may have no status or level, but there may be an output low or input no pull depending on a charge status. BATT_SENSE may have a status of input and a no pull level. Function HLC_SENSE may have an input status and a no pull level. Function STROBE may have a status of an input and a no pull level.

Step 2 may have an action to disable the battery. Function BATT_EN may have a status of an input and a no pull level. Function BATT_SENSE may have a status of input and a no pull level. Function HLC_SENSE may have a status of input and a low level. Function STROBE may have a status of input and no pull.

Step 3 may have an action to activate the STROBE. Function BATT_EN may have a status of input and a no pull level. Function BATT_SENSE may have a status of input and a no pull level. Function of HLOC_SENSE may have a status of input and a no pull level. Function STROBE may have a status of output and a low level.

Step 4 may have an action to activate an ADC. A delay may be determined. Function BATT_EN may have status of an input and a no pull level. Function BATT_SENSE may have a status of input (ADC). Function HLC_SENSE may have a status of input (ADC). Function STROBE may have a status of output and a low level.

Step 5 may have an action to measure BATT_SENSE voltage. A sampling time may be 6 microseconds for fADC=16 MHz. Function BATT_EN may have status of an input and a no pull level. Function BATT_SENSE may have a status of input (ADC). A digital ADC value may range from 0 to 4095. Function HLC_SENSE may have a status of input (ADC). Function STROBE may have a status of output and a low level.

Step 6 may have an action to measure HLC_SENSE voltage. Sampling time may be 6 microseconds for f(ADC)=16 MHz. Function BATT_EN may have a status of input and a no pull level. Function BATT_SENSE may have a status of an input (ADC). Function HLC may have a status of an input (ADC). A digital ADC value may range from 0 to 4095. Function STROBE may have a status of an output and a low level.

Step 7 may have an action to compare battery voltage and HLC voltage. If the battery voltage is lower than the HLC voltage, then the battery is missing or empty. If ADC (HLC_SENSE)*HLCcal<=ADC(BATT_SENSE)*Balcal, then the battery is present else it is missing.

A suggested frequency for steps 1 to 7 is about 8 Hz.

There may be a calculation of the HLC voltage.

Step 8 may have an action of measuring Vcc. Measuring steps may incorporate: 1) Fetch VREFINT_CA1 from memory address 0x1FF800F8-0x1FF800F9; 2) The internal reference voltage must be started at least 3 ms before the beginning of the AD-conversion (not much more, the reference may draw up to 2.3 uA); 3) The reference voltage buffer for ADC needs to be started at least 10 us before the beginning of the AD-conversion (not much more, the buffer draws up to 25 uA); 4) The TSVREFE bit in the ADC_CCR register should be set to enable the internal reference voltage; 5) The ADON and TSVREFE bits should be set at the same time; 6) The sampling time of the ADC_IN17 should be set at least 4 us (SMPx bits=101 at 16 MHz ADC-clock); 7) Measure the voltage of the internal reference which is connected to ADC_IN17 with the ADC at a 12 bit resolution, right aligned (the ADC-value may be VMEASURE); and 8) VHLC may be calculated.

$$Vcc = (VREFINT\_CAL/MEASURE)*3V.$$

One may switch off ADC, reference voltage buffer for ADC, and internal reference voltage; one may reset the TSVREFE bit. A suggested frequency (step 8) may be one per minute.

Step 9 may have an action of calculating V(HLC) using the latest results from steps 6 and 8:

V(HLC)=ADC(HLC_SENSE)/4095*Vcc/33*43=>V(HLC)=ADC(HLC_SE NSE)/3143*Vcc. A suggested frequency may be (step 9) 8 Hz.

Step 10 may have an action of setting a charge status. If V(HLC<V(HLCmin), then (remark: V(HLCmin)=to be determined (3.3 v) enable battery=>go to step 11, else disable battery=>go to step 17. Suggested frequency (step 11 and following steps) may be 8 Hz.

Current measurement may be taken.

Step 11 may have an action of enabling a battery. Function BATT_EN may have a status of output and a low level. Function BATT_SENSE may have a status of input (ADC). Function HLC_SENSE may have a status of input (ADC). Function STROBE may have a status of output and a low level.

Step 12 may have an action of delay. Function BATT_EN may have a status of output and a low level. Function BATT_SENSE may have a status of input (ADC). Function HLC_SENSE may have a status of input (ADC). Function STROBE may have 3 a status of output and a low level.

Step 13 may have an action to measure BATT_SENSE voltage. Sampling time may be 6 us for fADC=18 MHz. Function BATT_EN may have a status of input and a no pull level. Function BATT_SENSE may have a status of input (ADC). Function HLC_SENSE may have a status input (ADC). Function STROBE may have a status of output and a low level.

Step 14 may have an action to measure an HLC_SENSE voltage. Sampling time may be 6 us for fADC=16 MHZ. Function BATT_EN may have a status of input and a no pull level. Function BATT_SENSE may have a status of input (ADC). Function HLC may have a status of input (ADC). Function STROBE may have a status of output and a low level.

Step 15 may have an action to set an idle mode. Function BATT_EN may have a status of an output and a low level. Function BATT_SENSE may have a status of an input and a no pull level. Function HLC_SENSE may have a status of input and a no pull level. Function STROBE may have a status of an input and a no pull level.

Step 16 may have an action to calculate discharge using latest results from steps 8, 14 and 15.

$$V(HLC) = ADC(HLC\_SENSE)*HLCcal$$

$$V(BATT) = ADC(BATT\_SENSE)*Batcal$$

$$deltaV = V(BATT) - V(HLC)$$

$$I = deltaV/47R + deltaV/(10KR + 33KR + 10KR + 33KR)$$

Total discharge=total discharge+1*125 ms (for a suggested frequency of 8 Hz.

Steps 17 and 18 should not be executed if steps 11 to 16 have been executed.

Step 17 may have an action to set an idle node. Function BATT_EN may have a status of input and a no pull level (no recharge of the HLC from a battery). Function BATT_SENSE may have a status of input and a no pull level. Function HLC_SENSE may have a status of an input and a no pull level. Function STROBE may have a status of an input and a no pull level.

Step 18 may have an action to calculate discharge using the latest results from steps 5 and 6.

$$H(HLC) = ADC(HLC\_SENSE)*HLCcal$$

$$V(BATT) = ADC(BATT\_SENSE)*Batcal$$

$$deltaV = V(BATT) - V(HLC)$$

$$I = deltaV/(10KR + 33KR + 10KR + 33KR)$$

Total discharge=total discharge+1*125 ms (for a suggested frequency of 8 Hz).

To recap, a voltage measurement and current control system may incorporate a switch, a battery having a first terminal connected to a first terminal of the switch, and a second terminal connected to a reference voltage, a resistor having a first terminal connected to a second terminal of the switch, a capacitor having a first terminal connected to a second terminal of the resistor and having a second terminal connected to the reference voltage, and a controller having an input voltage supply terminal connected to the first terminal of the capacitor and a second terminal connected to the reference voltage, having a first input connected to the first terminal of the battery, having a second input connected to the first terminal of the capacitor, having a first output connected to a third terminal of the switch, and having a second output connected to voltage dividers for the first and second inputs of the controller.

The switch may be turned on with a signal from the controller when the voltage of the capacitor is below a first voltage limit. The switch may be turned off with a signal from the controller when the voltage of the capacitor is above a second voltage limit.

When the switch is on, the charge current may be proportional to a voltage across the resistor that is connected between the switch and the capacitor.

Current consumption may be calculated at the controller from the voltage measured across the resistor that is connected between the switch and the capacitor, a value of the resistor, and a duty cycle of the switch.

The charge current at the first terminal of the capacitor may be within a predefined range as given by the first and second voltage limits and a value of the resistor for a current that can be measured within a predetermined tolerance relative to a calculated value based on components of the system.

When the battery is being discharged, internal resistance of the battery may increase or the voltage of the battery may decrease, to result in an increase of the duty cycle. An amount of discharge of the battery may be detected by a measurement of the duty cycle. When the duty cycle reaches between 90 percent and 100 percent, the battery may approach being empty but have sufficient charge for a predetermined time period as indicated by an amount of current draw from the battery by an instrument for which the battery is providing power.

The second voltage limit may restrict a voltage to the input voltage supply terminal of the controller, up to an amount that is still harmless to the controller.

An approach for controlling voltage and measuring current, may incorporate connecting a first terminal of a switch to a first terminal of a resistor, connecting a second terminal of the resistor to a first terminal of a capacitor, connecting a second terminal of the capacitor to a ground terminal, connecting a first power terminal of a controller to the first terminal of the capacitor and a second power terminal of the controller to the ground terminal, connecting a first input terminal of the controller to a second terminal of the switch, a second input of the controller to the first terminal of the capacitor, connecting a first output of the controller to a control terminal of the switch, and a second output of the controller to a second terminal of the switch, and connecting a first terminal of a battery holder or connector to the second terminal of the switch, and a second terminal of the battery holder or connector to the ground terminal.

The approach may further incorporate inserting a battery in the battery holder or connector with a positive terminal of the battery connected to the first terminal of the battery holder or connector and a negative terminal of the battery connected to the second terminal of the battery holder or connector.

The switch may be a P-channel FET having a drain as the first terminal of the switch, a source as the second terminal of the switch, and a gate as the control terminal of the switch.

The approach may further incorporate connecting a pull-up resistor across the source and the gate of the FET, inserting a first voltage divider at the first input terminal of the controller, and inserting a second voltage divider at the second input terminal of the controller.

A battery charge detection circuit may incorporate a battery receptacle having a first terminal for connection to a positive terminal of a battery and a second terminal for connection to a negative terminal of the battery, a switch having a first terminal connected to the first terminal of the receptacle, and having a second terminal and a third terminal, a resistor having a first terminal connected to the third terminal of the switch and having a second terminal, and a capacitor having a first terminal connected to the second terminal of the resistor, and having a second terminal connected to a ground terminal and to the second terminal of the battery receptacle.

The circuit may further incorporate a battery inserted or situated in the battery receptacle with connections made between the first terminal of the battery receptacle and the positive terminal of the battery, and between the second terminal of the battery receptacle and the negative terminal of the battery.

The switch may be turned on when the voltage at the first terminal of the capacitor relative to the ground is below a first predetermined voltage limit. The switch may be turned off when the voltage at the first terminal of the capacitor is above a second predetermined voltage.

When the switch is on, a voltage between the first and second terminals of the resistor may be measured. The voltage measured may be proportional to a charge current at the capacitor.

The voltage measured divided by the resistance of the resistor may indicate an amount of charge current to the capacitor.

An average current consumption may be determined by the amount of charge current and a duty cycle of the switch.

The charge current may be constrained to a predefined range according to the first predetermined voltage and the second predetermined voltage.

The amount of charge current may be measured with an accuracy within a range of plus and minus five percent of a verified actual value.

When the battery is discharged, its internal resistance may increase and thus the duty cycle of the switch may increase. Measuring the duty cycle as it becomes one hundred percent may lead to an indication that the battery is almost totally discharged but at that moment the battery can be exchanged for a battery having more charge before the power available becomes insufficient for a supported circuit or instrument to function or operate, or to provide a low battery alarm, warning signal, or other operation or function.

Any publication or patent document noted herein may hereby be incorporated by reference to the same extent as if each individual publication or patent document was specifically and individually indicated to be incorporated by reference.

In the present specification, some of the matter may be of a hypothetical or prophetic nature although stated in another manner or tense.

Although the present system and/or approach has been described with respect to at least one illustrative example, many variations and modifications will become apparent to those skilled in the art upon reading the specification. It is therefore the intention that the appended claims be interpreted as broadly as possible in view of the related art to include all such variations and modifications.

What is claimed is:

1. A voltage measurement and current control system comprising:
   a switch;
   a battery having a first terminal connected to a first terminal of the switch, and a second terminal connected to a reference voltage;
   a resistor having a first terminal connected to a second terminal of the switch;
   a capacitor having a first terminal connected to a second terminal of the resistor and having a second terminal connected to the reference voltage; and
   a controller having an input voltage supply terminal connected to the first terminal of the capacitor and a second terminal connected to the reference voltage, having a first input connected to the first terminal of the battery, having a second input connected to the first terminal of the capacitor, having a first output connected to a third terminal of the switch, and having a second output connected to voltage dividers for the first and second inputs of the controller.

2. The system of claim 1, wherein:
   the switch is turned on with a signal from the controller when the voltage of the capacitor is below a first voltage limit; and
   the switch is turned off with a signal from the controller when the voltage of the capacitor is above a second voltage limit.

3. The system of claim 2, wherein when the switch is on, the charge current is proportional to a voltage across the resistor that is connected between the switch and the capacitor.

4. The system of claim 3, wherein current consumption is calculated at the controller from the voltage measured across the resistor that is connected between the switch and the capacitor, a value of the resistor, and a duty cycle of the switch.

5. The system of claim 3, wherein the charge current at the first terminal of the capacitor is within a predefined range as given by the first and second voltage limits and a value of the resistor for a current that can be measured within a predetermined tolerance relative to a calculated value based on components of the system.

6. The system of claim 4, wherein:
when the battery is being discharged, internal resistance of the battery increases or the voltage of the battery decreases, which results in an increase of the duty cycle;
an amount of discharge of the battery is detected by a measurement of the duty cycle; and
when the duty cycle reaches between 90 percent and 100 percent, the battery approaches being empty but has sufficient charge for a predetermined time period as indicated by an amount of current draw from the battery by an instrument for which the battery is providing power.

7. The system of claim 2, wherein the second voltage limit restricts a voltage to the input voltage supply terminal of the controller, up to an amount that is still harmless to the controller.

8. A method for controlling voltage and measuring current, comprising:
connecting a first terminal of a switch to a first terminal of a resistor;
connecting a second terminal of the resistor to a first terminal of a capacitor;
connecting a second terminal of the capacitor to a ground terminal;
connecting a first power terminal of a controller to the first terminal of the capacitor and a second power terminal of the controller to the ground terminal;
connecting a first input terminal of the controller to a second terminal of the switch, a second input of the controller to the first terminal of the capacitor;
connecting a first output of the controller to a control terminal of the switch, and a second output of the controller to the second terminal of the switch; and
connecting a first terminal of a battery holder or connector to the second terminal of the switch, and a second terminal of the battery holder or connector to the ground terminal.

9. The method of claim 8, further comprising inserting a battery in the battery holder or connector with a positive terminal of the battery connected to the first terminal of the battery holder or connector and a negative terminal of the battery connected to the second terminal of the battery holder or connector.

10. The method of claim 9, wherein the switch is a P-channel FET having a drain as the first terminal of the switch, a source as the second terminal of the switch, and a gate as the control terminal of the switch.

11. The method of claim 10, further comprising:
connecting a pull-up resistor across the source and the gate of the FET;
inserting a first voltage divider at the first input terminal of the controller; and
inserting a second voltage divider at the second input terminal of the controller.

12. A battery charge detection circuit comprising:
a battery receptacle having a first terminal for connection to a positive terminal of a battery and a second terminal for connection to a negative terminal of the battery;
a switch having a first terminal connected to the first terminal of the receptacle, and having a second terminal and a third terminal;
a resistor having a first terminal connected to the third terminal of the switch and having a second terminal;
a capacitor having a first terminal connected to the second terminal of the resistor, and having a second terminal connected to a ground terminal and to the second terminal of the battery receptacle; and
a controller having a first power terminal connected to the first terminal of the capacitor and a second power terminal connected to the ground terminal, having a first input terminal connected to the first terminal of the switch, having a second input terminal connected to the first terminal of the capacitor, having a first output connected to the second terminal of the switch, and having a second output connected to the first terminal of the switch.

13. The circuit of claim 12, further comprising a battery inserted or situated in the battery receptacle with connections made between the first terminal of the battery receptacle and the positive terminal of the battery, and between the second terminal of the battery receptacle and the negative terminal of the battery.

14. The circuit of claim 13, wherein:
the switch is turned on when the voltage at the first terminal of the capacitor relative to the ground is below a first predetermined voltage limit; and
the switch is turned off when the voltage at the first terminal of the capacitor is above a second predetermined voltage.

15. The circuit of claim 14, wherein:
when the switch is on, a voltage between the first and second terminals of the resistor is measured; and
the voltage measured is proportional to a charge current at the capacitor.

16. The circuit of claim 15, wherein the voltage measured divided by the resistance of the resistor indicates an amount of charge current to the capacitor.

17. The circuit of claim 16, wherein an average current consumption is determined by the amount of charge current and a duty cycle of the switch.

18. The circuit of claim 16, wherein the charge current is constrained to a predefined range according to the first predetermined voltage and the second predetermined voltage.

19. The circuit of claim 18, wherein the amount of charge current is measured with an accuracy within a range of plus and minus five percent of a verified actual value.

20. The circuit of claim 17, wherein:
when the battery is discharged, its internal resistance increases and thus the duty cycle of the switch increases; and
measuring the duty cycle as it becomes one hundred percent leads to an indication that the battery is almost totally discharged but at that moment the battery can be exchanged for a battery having more charge before the power available becomes insufficient for a supported circuit or instrument to function or operate.

* * * * *